United States Patent [19]
Stopper

[11] Patent Number: 5,856,775
[45] Date of Patent: *Jan. 5, 1999

[54] PROGRAMMABLE THIN FILM FILAMENT RESISTOR AND METHOD OF CONSTRUCTING SAME

[75] Inventor: Herbert Stopper, Harbor Springs, Mich.

[73] Assignee: Pico Systems, Inc., Harbor Springs, Mich.

[*] Notice: This patent issued on a continued prosecution application filed under 37 CFR 1.53(d), and is subject to the twenty year patent term provisions of 35 U.S.C. 154(a)(2).

[21] Appl. No.: 665,432

[22] Filed: Jun. 18, 1996

[51] Int. Cl.⁶ .............................. H01C 1/012; H01C 1/02
[52] U.S. Cl. ........................ 338/310; 338/252; 338/306
[58] Field of Search ................................ 338/310, 311, 338/252, 253, 306

[56] References Cited

U.S. PATENT DOCUMENTS

| | | | |
|---|---|---|---|
| 4,300,115 | 11/1981 | Ansell et al. ............................ | 338/314 |
| 4,741,964 | 5/1988 | Haller .................................... | 428/446 |
| 4,839,700 | 6/1989 | Ramesham ............................. | 357/2 |
| 4,952,902 | 8/1990 | Kawaguchi et al. ................... | 338/22 R |
| 5,164,699 | 11/1992 | Smith et al. ............................ | 338/310 |
| 5,284,788 | 2/1994 | Spratt ..................................... | 437/52 |
| 5,434,432 | 7/1995 | Spratt ..................................... | 257/50 |
| 5,447,880 | 9/1995 | Lee et al. ................................ | 437/60 |
| 5,583,369 | 12/1996 | Yamazaki et al. ..................... | 257/635 |

Primary Examiner—Peter S. Wong
Assistant Examiner—Bao Q. Vu
Attorney, Agent, or Firm—Brinks Hofer Gilson & Lione

[57] ABSTRACT

The present invention includes a programmable thin film filament resistor and method of constructing same. The finished construction includes: a core member of hydrogenated amorphous silicon; upper and lower electrodes made of a barrier metal such as molybdenum or tungsten applied to the upper and lower surfaces of the core member; and, backing layers, typically made of aluminum, applied to the outside surfaces of the electrodes. An insulator may be added to the upper surface of the core member. A programming voltage is applied to the electrodes, creating a discharge path between the upper and lower electrodes. When a critical current is reached, a filament is formed as the aluminum of the backing layers, the barrier metal of the electrodes, and the amorphous silicon are fused together. The result is a filament resistor with linear properties within a defined operating range. In an alternate embodiment, the upper and lower electrodes are overlapped in an alternating pattern, creating fusion zones. When the programming voltage is applied, an electric field forms within the fusion zones which creates multiple filaments with linear resistive qualities.

31 Claims, 4 Drawing Sheets

PROGRAMMABLE THIN FILM FILAMENT RESISTOR AND METHOD OF CONSTRUCTING SAME

FIELD OF THE INVENTION

This invention relates to the creation of resistors within a thin film deposition environment for electrical applications, for example, use in multi-chip modules.

BACKGROUND

A multi-chip module ("MCM") consists of a number of unpackaged chips which are mounted directly on and electrically interconnected by a passive substrate, thereby enabling high density packaging. The chips in a MCM are usually active integrated circuit chips. However, it is not always possible to implement a desired module function exclusively with integrated circuit chips. Specifically, there is often a need for discrete resistors. In digital circuits, discrete resistors may be needed as transmission line terminators, pull-ups or pull-downs for die outputs, and tie-ups or tie-downs for die inputs. In analog circuits, discrete resistors may be needed for operational amplifier networks.

An unpackaged, single resistor, also known as a "single resistor chip," is available and can be mounted on the substrate together with the active chips. The single resistor chip, however, is highly undesirable. Small in comparison to the active chips, the single resistor chip still consumes inordinate amounts of substrate surface area and is much more difficult to assemble. It may also introduce noticeable parasitic capacitances and inductances.

In the past, attempts have been made to mitigate the disadvantages of the single resistor chip by "sweeping" a number of single resistors together to form a multi-resistor chip. This leads, however, to a different problem. Whenever the resistors in a given multi-resistor chip require different values because of a specific electrical application, a standard "off-the-shelf" chip in which all the resistors have equal values can no longer be used.

The need for resistors having differing values of resistance in a multi-resistor chip may occur even if the application calls for equal resistances. In the case of pull-down resistors or transmission line terminators, for instance, an application may need a large number of equal resistors. However, if the resistors or terminators are concentrated in a multi-resistor chip, each resistor has to be connected by a trace on the substrate to connection points which then invariably adds the resistance of the trace itself to the resistance of the individual resistor. Thus, the resistance of each individual resistor on a multi-resistor chip may have to be individually adjusted in order to compensate for the trace resistance to obtain the required total resistance.

Another approach previously used to mitigate the single resistor chip problem has been to integrate the resistors as thin-film resistors into the substrate. The conventional method of constructing thin film resistors involves creating a horizontal rectangle of resistive material located within a film (usually by etching or a similar process). Disadvantages of the thin film approach include the need for additional steps and the introduction of different materials to the substrate manufacturing process. The thin film resistors may also consume significant amounts of substrate area, whereby reducing the area available for the necessary interconnect traces.

SUMMARY

To overcome the above-mentioned problems, a programmable thin film filament resistor and a method to create such a resistor are disclosed. The method of construction includes the formation of a conductive, vertical filament through an insulating core member (film) of amorphous silicon which is sandwiched between two metal backing layers. The filament is burned through the core member under precise electrical control after the deposition of the film. Due to the electrical control, the resistance value of the filament resistor depends less on the film dimensions and more on the applied current, which makes the resistor electrically programmable (for the present invention, "programmable" is defined as capable of fixing a resistive value by controlling an electrical current, as opposed to "programmable" in the computer software sense).

In the case of integrated substrate resistors, the metal layers are identical with the signal trace layers. In the case of a multi-resistor chip, the metal layers are the same layers which are used to provide the resistor terminals.

Burning filaments through amorphous silicon has been used in the past for the purpose of programming interconnection patterns on substrates, and the programmable link used is referred to as an "antifuse." However, an antifuse as such is not a usable resistor because of its limited operating range. The present application discloses how to expand the operating range of the filament by electrode design so that it can be functionally utilized as a resistor.

Being comprised of a filament whose diameter is in the micrometer range, the resistor according to the present invention is inherently superior to a conventional thin film resistor inasmuch as its substrate area consumption and the associated electrical parasitics are minimal. It solves the problem of providing resistors with different values in a standard multi-resistor chip by individual programming of generic elements. The present invention typically adds only one layer, namely, the amorphous-silicon layer, to a conventional substrate manufacturing process in order to implement integrated resistors. If a substrate manufacturing process already encompasses antifuse technology, then no additional layers are needed.

It is therefore an object of the present invention to create a high-quality filament resistor which can be used in multi-resistor chips or as an integrated resistor in MCM substrates.

It is further an object of the present invention to create a high-quality filament resistor which can be used in combination with a small film resistor to enhance the power limit of the filament resistor.

It is still further an object of the present invention to create a resistor having a large resistive value by using a series of smaller value filament resistors.

Additional advantages and features of the present invention will become apparent from reading the detailed description of the preferred embodiments which make reference to the following set of drawings.

DETAILED DESCRIPTION

Figure 1:
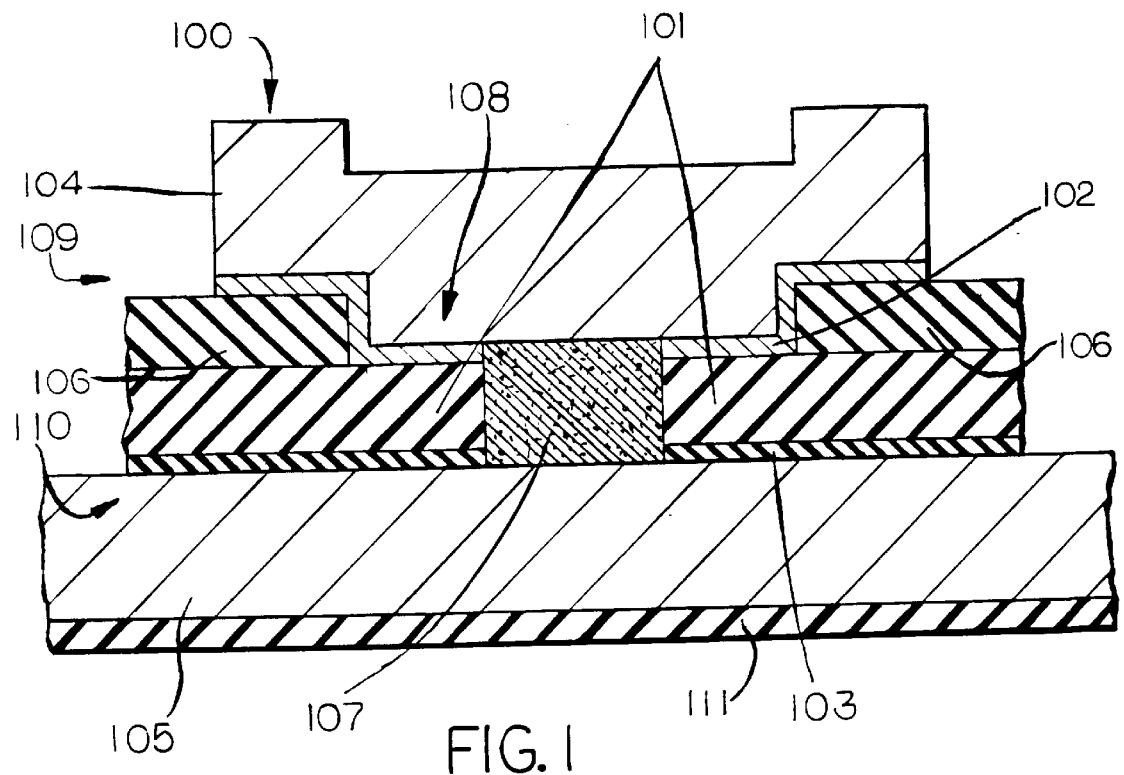
FIG. 1 is a vertical cross section of a resistor of the present invention.

FIG. 1 shows the principal construction of a programmable thin film filament resistor 100. To begin, a lower backing layer 105 is formed by applying a coating of aluminum or like metal to the upper surface a substrate 111, typically made of silicon. The application process used is sputtering or its equivalent and the thickness of the lower backing layer 105 is approximately 2 micrometers for the preferred embodiment of the present invention. Next, a lower electrode 103 is formed by sputtering a layer of barrier metal onto the upper surface of the previously formed lower backing layer 105. The barrier metal may be molybdenum, tungsten, or equivalent at a thickness of about 0.1 micrometers. This aluminum and barrier metal combination make up the lower trace 110.

A core material, e.g., hydrogenated amorphous silicon or the like, is added next to the upper surface of the lower electrode 103 to create the core member 101. A plasma-enhanced chemical vapor deposition process ("PECVD") is used to add the core material at a final thickness of about 0.5 micrometers.

An insulator material, in the instant case, silicon dioxide, is applied to the upper surface of the core member 101 at a thickness of about 2 micrometers to form an insulating layer 106. The PECVD method of application is again used. After the formation of the insulating layer 106, an aperture 108 is created in the insulating layer 106 which exposes a portion of the core member 101. The aperture 108 usually created by etching or a similar process.

Next, a second layer of barrier metal is applied to form the upper electrode 102. Tungsten or molybdenum is sputtered onto the upper surfaces of the insulating layer 106 and the exposed portion of the core member 101, again at a thickness of approximately 0.2 micrometers.

An upper backing layer 104 is then created by sputtering a layer of aluminum or the like onto the upper surface of the upper electrode 102 at a thickness of about 2 micrometers. Together, the upper electrode 102 and the upper backing layer 104 make up the upper trace 109.

The final step in the formation process is the creation of the filament 107, described in further detail herein, which occurs when an electrical voltage is applied to the electrodes 102 and 103. After "firing" or "programming," the electrodes 102 and 103 are connected to each other via the filament 107, which is made up of an alloy formed by the fusion of the metals in the backing layers 104 and 105, the electrodes 102 and 103, and the core member 101. In a typical construction, the filament 107 would be made of a aluminum-molybdenum-silicon alloy and would have linear (ohmic) resistive characteristics over a defined operating range. The area in which the filament 107 is permitted to form can be confined either as shown in FIG. 1 by the aperture 108 in the insulator 106 or by a limited overlap between the electrodes 102 and 103, discussed further herein.

The final configuration of a typical resistor 100 has the upper trace 109 extending along the substrate 111 in one direction and the lower trace 110 extending in a direction perpendicular to the upper trace 109. The upper and lower traces 109 and 110 are located in separate horizontal planes with the filament 107 bridging the two.

Figure 2A:
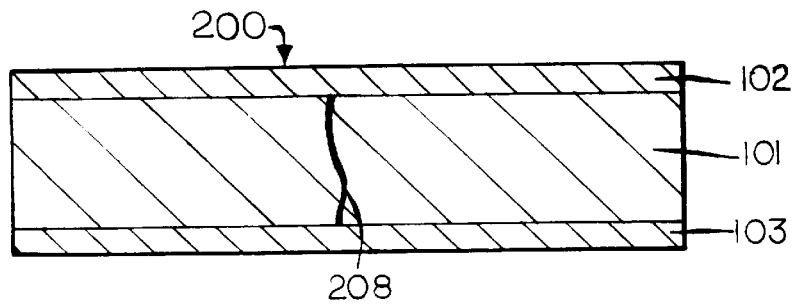
FIG. 2A is a partial cross section of the resistor of FIG. 1 showing a conductive path extending between the upper and lower electrodes.
Figure 2B:
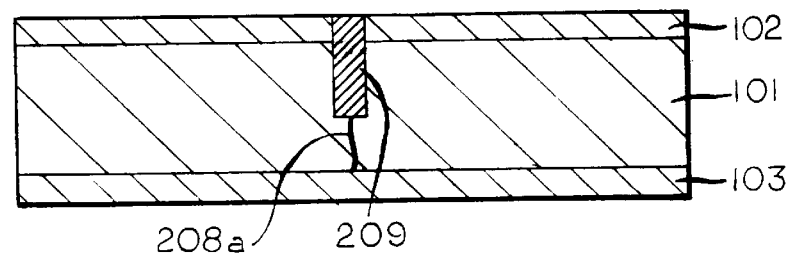
FIG. 2B is a partial cross section of the resistor of FIG. 1 showing a partially developed filament forming along the conductive path.

FIGS. 2A–2E illustrate the developmental steps of the method of the present invention from a "latent" (i.e., unformed) programmable filament resistor 200 to the completed resistor 100 as shown in FIG. 1 (for the sake of clarity, only the upper and lower electrodes 102 and 103 and the core member 101 are shown in FIGS. 2A–2E; the backing layers 104 and 105 and the insulator 106 shown in FIG. 1 are omitted from FIGS. 2A–2E). FIG. 3 is a voltage/current/resistance/power diagram which, among other things, describes the development of the resistor 100 in electrical terms.

In its latent state and at normal circuit operating voltages, the filament resistor 100 is, for all practical purposes, an insulator where leakage currents are in the picoamp range. The situation changes as an electrical programming pulse is applied to the ends of the backing layers 104 and 105 and the voltage is raised toward a characteristic threshold voltage. The threshold voltage is a function of the thickness of the core member 101 and is typically about 30 volts for the preferred embodiment of the present invention. At this voltage, the leakage current increases rapidly, which is shown as region 308 of formation curve 301 in FIG. 3. The corresponding physical status is shown in FIG. 2A as the establishment of a discrete discharge path 208 whose current overwhelms the leakage current through the surrounding core member 101 (that is, whenever a voltage is applied to the electrodes 102 and 103, a leakage current through the core member 101 exists; it is when the critical voltage is reached, however, that the discharge path 208 is created). The nature of this discharge is purely electrical, i.e., it does not involve any physical changes to the material of the core member 101 and is completely reversible.

As the current increases into region 309 of formation curve 301 in FIG. 3, the temperature in the discharge path 208 becomes high enough to effect permanent changes. Starting from the upper electrode 102, a highly conductive partial filament 209 grows, as shown in FIG. 2B. As the conductive partial filament 209 increases in length towards the lower electrode 103, the amount of material of the core member 101 though which current must pass decreases, thus requiring less voltage to sustain the current through the remaining discharge path 208a, also shown in region 309 of formation curve 301.

Once the actual formation of the partial filament 209 in FIG. 2B begins, the growth of the partial filament 209 is irreversible. If the current was decreased at this point, the discharge path 208a through the remaining amount of material of core member 101 would shrink and ultimately disappear but the partial filament 209 would remain.

Figure 2C:
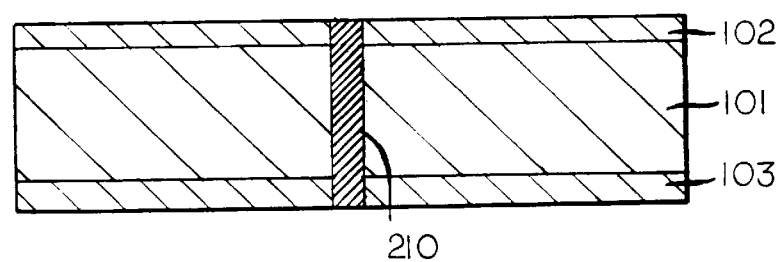
FIG. 2C is a partial cross section of the resistor of FIG. 1 showing a developed filament extending between the upper and lower electrodes.
Figure 2D:
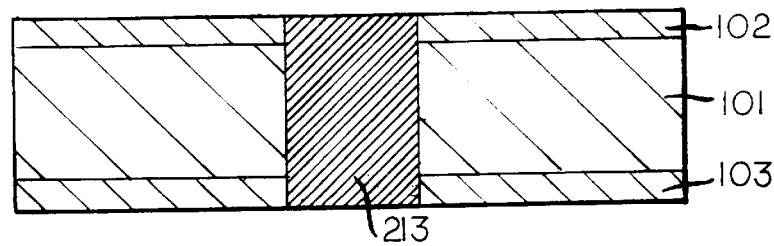
FIG. 2D is a partial cross section of the resistor of FIG. 1 showing a larger filament extending between the upper and lower electrodes.
Figure 2E:
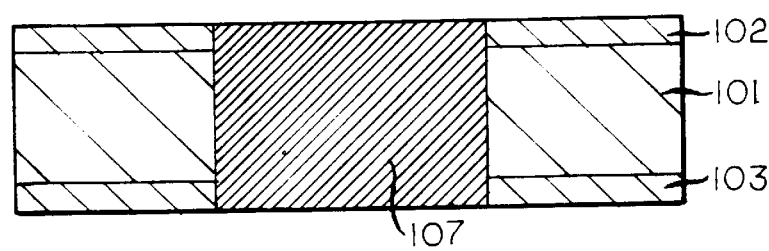
FIG. 2E is a partial cross section of the resistor of FIG. 1 showing a completely developed filament extending between the upper and lower electrodes.
Figure 3:
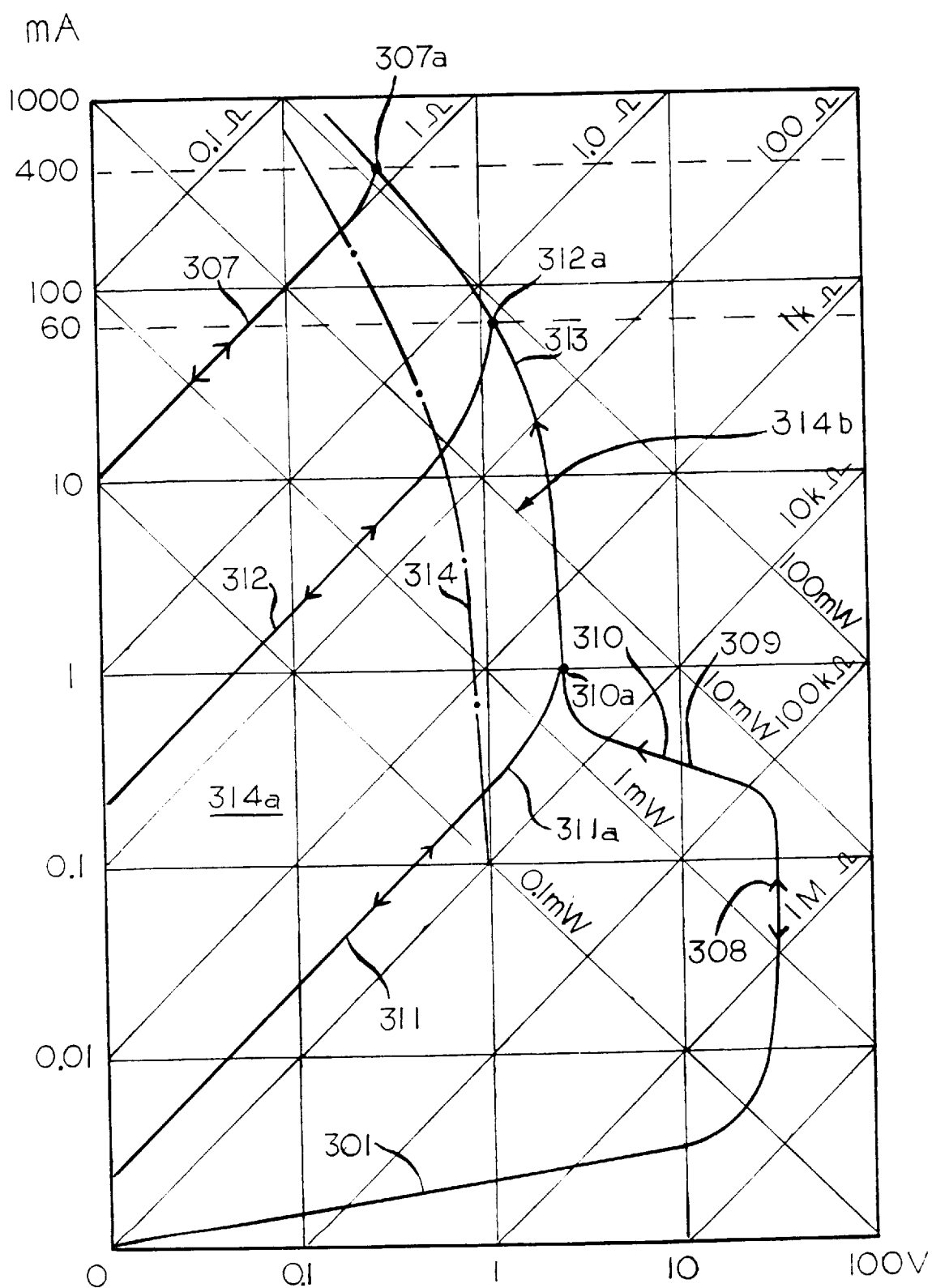
FIG. 3 is a graph showing the relationship between filament growth, applied voltages and currents, and power ratings and resistance values for the formation and operation of the resistor of the present invention.

If, on the other hand, the current is allowed to increase further, as shown in FIG. 3 as region 310, the partial filament 209 will continue to increase in length until it comes into contact with the lower electrode 103, as shown in FIG. 2C, and shown as critical point 310a in FIG. 3. At this point in the process, a permanent conduction path with resistive qualities, that is, a narrow filament 210, has been created between the electrodes 102 and 103. The composition of the narrow filament 210 is a combination of the materials found in the core member 101, the electrodes 102 and 103, and the backing layers 104 and 105. In the preferred embodiment the filament alloy is silicon-molybdenum-aluminum, but other similar materials may be substituted.

If the current was discontinued beyond the critical point 310a at which the narrow filament 210 solidly bridges the electrodes 102 and 103 (about 1 milliamp), as depicted by operating curve 311 of FIG. 3, the narrow filament 210 would act as a resistor with a value of about 5 k Ω. If the current is allowed to increase further, the width of the narrow filament 210 increases horizontally, as depicted by the larger filament 213 shown in FIG. 2D. Additionally, as the larger filament 213 increases in width, the resistance value decreases as shown by region 313 of formation curve 301 in FIG. 3.

The increase of the width of the larger filament 213, corresponding to region 313 of FIG. 3, is again irreversible; that is, the larger filament 213 cannot be reduced in size. Once the current is decreased after having reached a peak value, for example, at point 312a, the operating point does not move in reverse along region 313 of formation curve 301 in FIG. 3, but rather moves along a new operating curve 312.

In the examples shown in FIG. 3, a resistor 100 with a value of 1Ω, shown as operating curve 307, can be created with a peak programming current of 400 milliamps, shown at point 307a, or a resistor with a value of 50 Ω, shown as operating curve 312, can be created with a peak programming current of 60 milliamps, shown at point 312a. Accordingly, any resistor 100 smaller than 5 k Ω can be created by the appropriate peak programming current of at least 1 milliamp.

The law which governs growth of the filament 107 is the required thermal balance between the heat generated in the filament 107 by the dissipated electrical power and the heat which can be thermally conducted away from the filament 107 at the formation temperature at which the (liquid) filament 107 can convert more nonconductive material (silicon) into conductive material (aluminum-molybdenum-silicon) by absorbing the metals from the electrodes 102 and 103. If the current through the filament 107 is increased, the electrical power increases accordingly and produces excess heat, which starts and maintains the conversion process until the growth of the filament 107 and its corresponding reduction of the filament resistance bring the electrical power back in line with the power which is thermally conducted away from the filament 107. If the current is reduced, the thermal balance is maintained by a corresponding temperature drop in the solid filament 107 but not by filament shrinkage.

At this point, the filament 107 as a resistor 100 departs from the filament 107 as an antifuse (not shown). In case of the antifuse (not shown), the only objective is to drive the resistance down as low as possible and to assure that it never returns to higher values. In the case of the resistor 100, however, its operating range must be carefully examined.

The filament resistor 100 is a perfect resistor as long as its usage is confined to the linear operating region 314a, that is, to the left of the operating boundary 314 in FIG. 3. Beyond operating boundary 314 in region 314b, the resistor 100 becomes non-linear. For example, operating curve 311 is linear to the left of operating boundary 314. However, as operating curve 311 passes from the linear operating region 314a across the operating boundary 314 (at about 1 volt and 0.2 milliamps) and into the region 314b, it becomes nonlinear, as shown by operating curve portion 311a. The same is true for the other two example operating curves 312 and 307. If the current used by a specific electrical application ever reaches and exceeds the original peak programming current, the resistor 100 will be re-programmed to a lower resistive value. In other words, the resistor 100, as such, will fail. Formation curve 301 of FIG. 3 is therefore not only the curve which determines the programming current needed to obtain a specific resistance value of a resistor 100 under construction, but also serves as the upper limits of the resultant resistor 100 from which the maximum sustaining voltage and the maximum sustaining current, as well as the maximum permissible power dissipation, can be derived.

Even though the resistive value of a filament resistor 100 can be programmed, there are still two obstacles which impede the functionality of the thin film filament resistor 100. First, the permissible power dissipation is too small for most applications. Second, the maximum resistance value is limited to approximately 5 k Ω (because a resistor 100 with a higher resistive value would be located at a point on the formation curve 301 in FIG. 3 prior to the complete development of the filament 107). Both problems are solved according to the present invention in the following ways.

If only a modest increase of the permissible operating power is needed, the formation curve 301 (and with it the linear operating boundary 314) can be shifted towards higher power levels (i.e., to the right in FIG. 3) by providing better cooling for the filament 107 during the formation process. If the thermal resistance between the filament 107 and the environment can be cut, for example, by one-half, then the power of formation and, hence, the maximum sustaining power limit will double due to the aforementioned law of a power equilibrium at the filament formation stage.

Figures 4A, 4B:
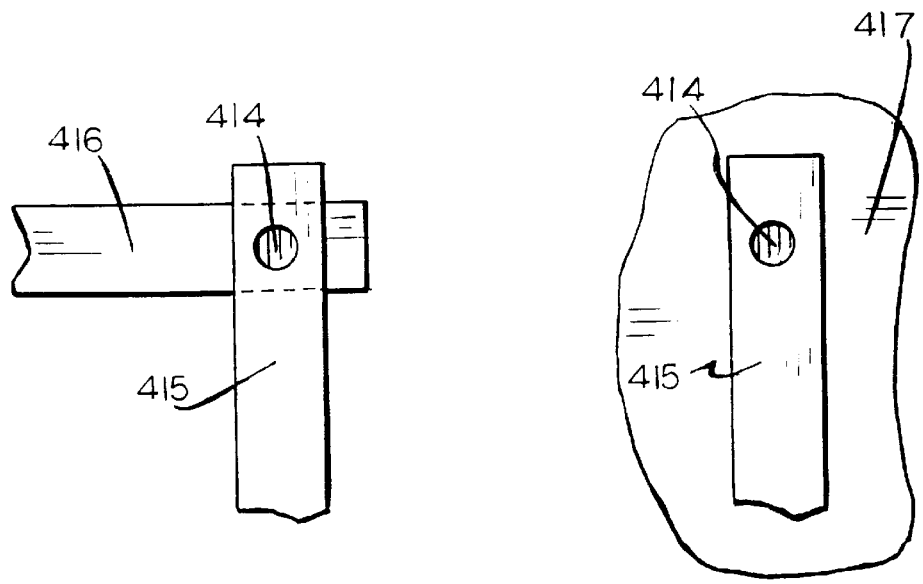
FIG. 4A is a plan view in which both leads to the resistor are traces which intersect at a common point.
FIG. 4B is a plan view in which one of the traces leading to the filament resistor of the present invention has been replaced by a power plane.

The thermal resistance is substantially determined by the properties of the aluminum traces 415 and 416, as shown in FIG. 4A (which correspond to the backing layers 104 and 105 in FIG. 1), leading to and from the filament 107. Traces 415 and 416 are located on different levels on the substrate (not shown). If one of the traces 416 is replaced by a full sheet of metal 417, also referred to as a "full metal plane," as shown in FIG. 4B, the thermal resistance will be nearly cut in half This replacement, while somewhat more costly, is especially practical if the specific electrical application requires that the resistor 100 be returned to a power plane at a common point.

Figure 5:
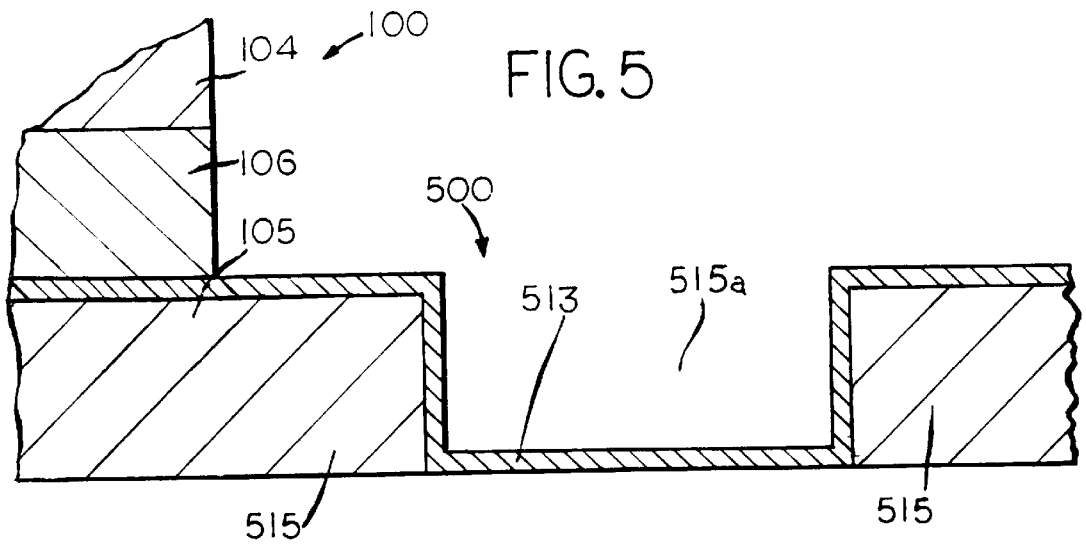
FIG. 5 is a elevational view showing a small fixed resistor inserted into a conductive trace.

For the case of relatively small resistors, another solution to resolve modest discrepancies between needed and permissible power is available. By combining a programmable filament resistor 100 with a fixed (non-programmable) thin film resistor 500 as shown in FIG. 5, modest power discrepancies can be resolved. Such a film resistor 500 can be easily made with the same process as long as its resistive value is small and the required accuracy is low. The film resistor 500 could be made by putting a gap 515a in the aluminum layer 515 but by continuing the trace with the molybdenum layer 513.

For modest resistor values in the 10–100 Ω range, the length of the film resistor 500 would be in the 10–100 micrometer range. Larger film resistors (not shown) could, of course, also be made but that would work against one of the objectives of the present invention, which is to minimize the total substrate area consumed by the programmable resistor 100.

A fixed thin film resistor 500 as proposed above requiring a very small value to augment a filament resistor 100 cannot be made with reasonably small tolerances. However, a filament resistor 100 used in conjunction with a fixed thin film resistor 500 can absorb the tolerance of the latter by appropriate programming. Thus, combining a programmable filament resistor 100 and a fixed thin film resistor 500 having a very small resistive value is mutually beneficial because each component eliminates the deficiency of the other.

The creation of 50 Ω terminators (not shown) for emitter coupled logic ("ECL") applications is a good example. A programming current of about 60 milliamps produces the desired resistor of 50 Ω as shown at point 312a of formation curve 301 in FIG. 3. The sustaining current of the resistor 100 would then also be about 60 milliamps (at about 70 milliwatts). However, the maximum allowable operating current for a stable, linear 50Ω resistor, according to the operational boundary 314, is about 10 milliamps, which corresponds to 0.5 volts and 5 milliwatts. The intended application unfortunately exceeds the given limit. The maximum operating values for a 50 Ω ECL terminator (not shown), as dictated by the ECL application, are 1.2 volts, 24 milliamps, and 29 milliwatts.

However, if the 50 Ω terminator (not shown) is divided into two 25 Ω resistors in series (not shown), then the reduced operating requirements of each of the two 25 ohm filament resistors (not shown) are within the permitted operating limits. The series resistors can be implemented by two different methods. First, a programmable thin film filament resistor 100 can be combined with a fixed resistor 500, as previously described. Second, two programmable thin film filament resistors 100 can be combined in series. Since the resistance of a programmable filament resistor 100 is controlled by the programming current and two filaments 107 in series (under the latter method) would see the same programming current, both filaments 107 would acquire the same resistance, which is needed in order to divide the operating power evenly.

Using two or more filament resistors 100 in series is also the solution to the second previously mentioned problem of achieving high resistive values. A 100 k Ω resistor (not shown), for instance, can be created by combining fifty 2 k Ω resistors (not shown) in series. While the formation of one 100 k Ω resistor (not shown) would surely result in resistive properties which would easily exceed stable limits, a string of fifty 2 k Ω resistors (not shown) would have an operating limit of 50 volts, 0.5 milliamps, and 25 milliwatts, as well as a sustaining limit of about 100 volts, 10 milliamps, and 1000 milliwatts.

It is not necessary (nor desirable) to assemble a series resistor (not shown) as a linear chain of fully constructed single resistors 100. Such "daisy-chaining" of individual resistors 100 would multiply the necessary substrate 111 surface area by the number of the resistors 100 in the chain, whereby occupying an inordinate amount of substrate 111 surface area. Referring back to FIG. 1, it is clear that the size of the filament 107 is small relative to the combined surface area of the surrounding construction elements (which include the core member 101, the upper and lower electrodes 102 and 103, the backing layers 104 and 105, the insulator 106, and the bonding pads, not shown). It is therefore an alternative embodiment of the present invention to compose large resistors 600b of multiple filaments 622 which have only two terminals (not shown), one at each end of the multiple resistor series. Such a structure is shown in FIGS. 6A and 6B.

Figure 6A:
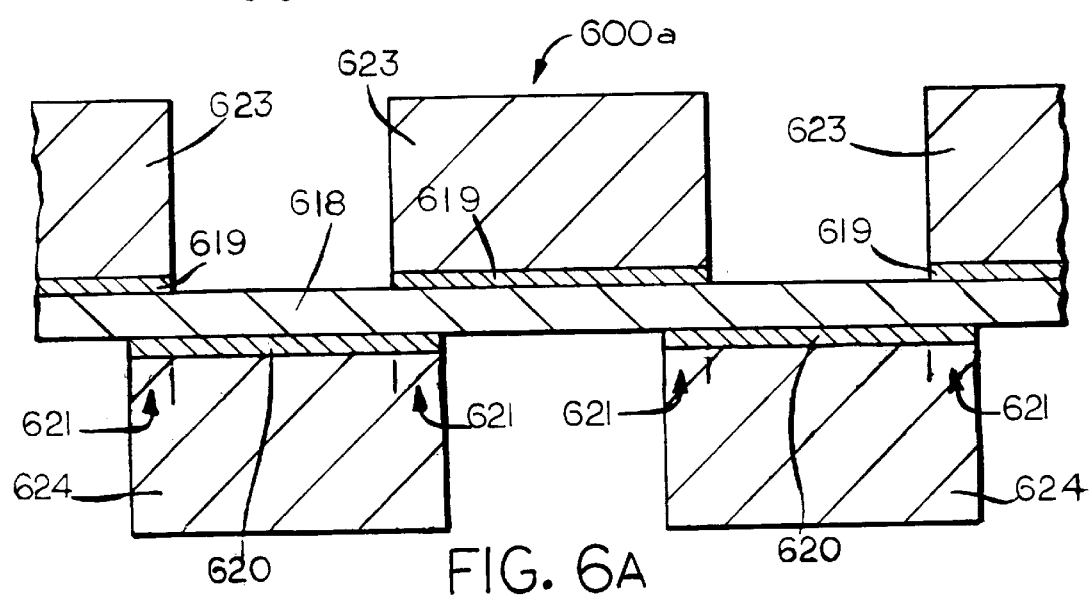
FIG. 6A is a cross sectional view of a series of latent filament resistors of the present invention prior to programming.

In FIG. 6A, a latent filament resistor 600a, that is, a resistor 600a prior to the application of the programming voltage, is shown. The upper and lower electrodes 619 and 620, respectively, are small segments of molybdenum or a like material positioned in an alternating pattern on the upper and lower surfaces of the core member 618. The electrodes 619 and 620 are positioned on the surface of the core member 618 such that the upper electrodes 619 overlap the lower electrodes 620 to form multiple fusion zones 621, as shown. The backing layers 623 and 624 abut the electrodes 619 and 620, respectively, and are connected to the bonding pads (not shown). As a programming voltage is applied, an electric field is created between the upper electrodes 619 and the lower electrodes 620 within the fusion zones 621. As the threshold current is reached, the materials of the backing layers 623 and 624, the core member 618, and the electrodes 619 and 620 are fused together to create filaments 622 as shown in FIG. 6B. Thus, a contiguous chain of "electrode 619/filament 622/electrode 620" segments is created to form a thin film series resistor 600b. As previously mentioned, the chain of series resistors 600b does not need to be extended linearly. It is possible to utilize a folded configuration (not shown) to further conserve valuable substrate surface area.

If the threshold voltage for filament formation would remain at about 30 volts, as shown in FIG. 3, a fifty-filament chain would require an initial programming voltage of 1500 volts. The required voltage can be reduced by making the core member 618 thinner, because the threshold voltage is approximately proportional to the thickness of the core member 618. A required threshold voltage of 30 volts would correspond to a core member 618 having a thickness of 0.5 micrometers.

Figure 6B:
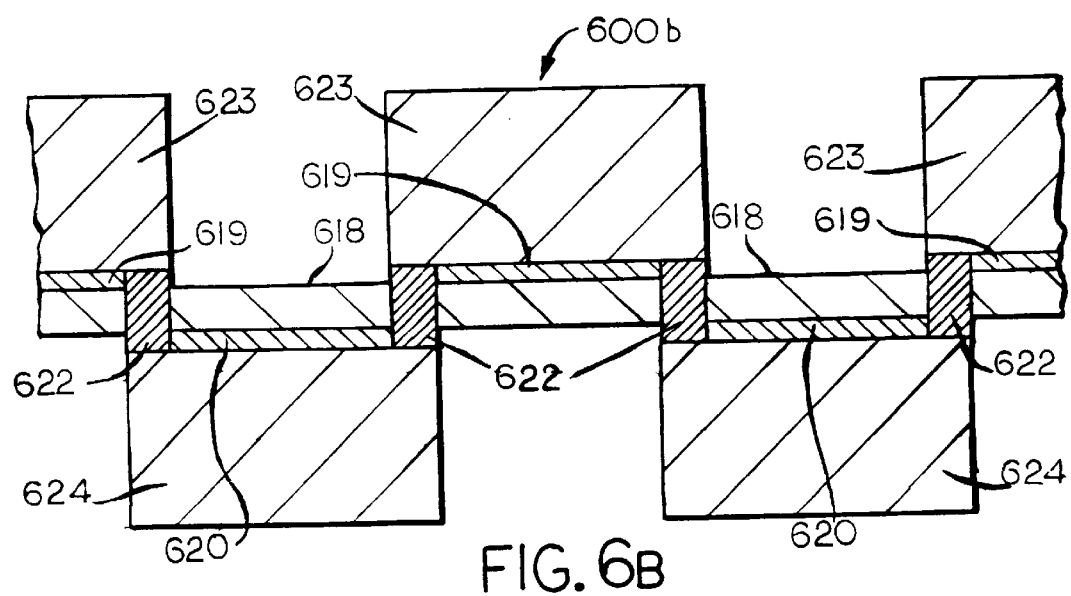
FIG. 6B is a cross sectional view of a series of filament resistors of the present invention, where the filament resistors have been created and connected in series.

In an alternate embodiment of the present invention, a series resistor 600b having a large cumulative resistive value can be created without the thick backing layers 623 and 624 shown in FIGS. 6A and 6B. The first step of the construction process (i.e., the application of the upper backing layer,) may be omitted and the thin layer of barrier metal used for lower electrode 620 may be applied directly to the upper surface of the substrate 111 (shown in FIG. 1). Similarly, the final step of the process may be eliminated, thus omitting the upper backing layer 623. Accordingly, the alloy of the finished filaments 622 in the alternate embodiment would lack aluminum (or its equivalent) as one of its components, which shifts the formation characteristics and operational boundary 314 (in FIG. 3) toward higher resistance per programming current or programming power. The omission of the backing layers 623 and 624, however, is permissible only when programming and operating currents are relatively small, as it is the case for relatively large resistors (not shown). In other applications, the backing layers 623 and 624 are essential for thermal dissipation because the thin electrodes 619 and 620 could not carry large currents without overheating.

Although the best mode contemplated by the inventor for carrying out the present invention as of the filing date hereof has been shown and described herein, it will be apparent to those skilled in the art that suitable modifications, variations, and equivalents may be made without departing from the scope of the invention, such scope being limited solely by the terms of the following claims.

What is claimed:

1. A thin programmable filament resistor, said resistor comprising:
    a substrate having an upper surface and a lower surface;
    a conductive lower trace, said conductive lower trace having an upper surface and a lower surface, at least a portion of said lower surface of said conductive lower trace being in physical contact with said upper surface of said substrate;
    a core member, said core member having an upper surface and a lower surface, at least a portion of said lower surface of said core member being in physical contact with said upper surface of said conductive lower trace;
    an insulator, said insulator having an upper surface and a lower surface, at least a portion of said lower surface of said insulator being in physical contact with at least a portion of said upper surface of said core member, said insulator having an aperture therethrough exposing a portion of said upper surface of said core member;
    a conductive upper trace, said conductive upper trace having an upper surface and a lower surface, at least a portion of said lower surface of said conductive upper trace being in physical contact with at least a portion of said upper surface of said insulator, at least a portion of said lower surface of said conductive upper trace further being in physical contact with said exposed portion of said core member; and
    a programmable filament, said programmable filament comprising an alloy of said conductive upper trace, conductive lower trace and core member,
    said programmable filament extending from said upper surface of said conductive lower trace through said core member to said lower surface of said conductive upper trace.

2. The resistor according to claim 1 wherein said first trace is oriented in a first direction, and said second trace is oriented in a second direction, said first direction being perpendicular to said second direction.

3. The resistor according to claim 1 wherein said first trace is located in a first horizontal plane and said second trace is located in a second horizontal plane.

4. The resistor according to claim 1 wherein said resistor has linear resistive properties over a defined operating range.

5. The resistor according to claim 1 wherein said core member comprises hydrogenated amorphous silicon.

6. The resistor according to claim 1 wherein said insulator comprises silicon dioxide.

7. The resistor according to claim 1 wherein said first trace comprises:
    a first electrode layer; said first electrode having an upper and a lower surface, said upper surface of said first electrode layer being in physical contact with said lower surface of said core member; and,
    a first backing layer, said first backing layer having an upper surface and a lower surface, said upper surface of said first backing layer being in physical contact with and coextensive with said lower surface of said first electrode layer, said lower surface of said first backing layer being in physical contact with said substrate.

8. The resistor according to claim 7 wherein said first electrode layer comprises a generally thin elongate strip.

9. The resistor according to claim 7 wherein said first electrode comprises a barrier metal.

10. The resistor according to claim 9 wherein said barrier metal comprises molybdenum.

11. The resistor according to claim 9 wherein said barrier metal comprises tungsten.

12. The resistor according to claim 7 wherein said first backing layer comprises aluminum.

13. The resistor according to claim 7 wherein said second trace comprises:
    a second electrode layer, said second electrode layer having an upper surface and a lower surface, said lower surface of said second electrode layer being in physical contact with at least a portion of said upper surface of said insulator, said lower surface of said second electrode layer further being in contact with said exposed portion of said core member;
    a second backing layer, said second backing layer having an upper surface and a lower surface, said lower surface of said second backing layer being in physical contact with and coextensive with said upper surface of said second electrode layer.

14. The resistor according to claim 13 wherein said second electrode layer comprises a thin elongate strip.

15. The resistor according to claim 13 wherein said second electrode comprises a barrier metal.

16. The resistor according to claim 15 wherein said barrier metal comprises molybdenum.

17. The resistor according to claim 15 wherein said barrier metal comprises tungsten.

18. The resistor according to claim 13 wherein said second backing layer comprises aluminum.

19. The resistor according to claim 1 further comprising a non-programmable thin film resistor in series with said programmable resistor.

20. The resistor according to claim 1 wherein said resistor comprises a plurality of thin film filament resistors in series.

21. A resistor, said resistor comprising:
    a conductive lower trace made of a first material,
    a core member made of a second material, said core member being fixed to said conductive lower trace;
    an insulator made of a third material, said insulator being fixed to said core member, said insulator having an aperture therein;
    a conductive upper trace made of the first material, said conductive upper trace being fixed to said core member; and,
    a filament, said filament extending from said conductive lower trace to said conductive upper trace, said filament comprising an alloy of the first and second materials and having a resistive value that is selected by applying a predetermined amount of electrical current to said conductive lower and conductive upper traces.

22. The resistor according to claim 21 further comprising a substrate, said first trace being fixed to said substrate.

23. The resistor according to claim 21 wherein said resistor has linear resistive properties over a defined operating range.

24. The resistor according to claim 21 further comprising a fixed thin film resistor in series with said resistor.

25. The resistor according to claim 22 wherein said resistor comprises a plurality of resistors in series.

26. A thin film filament resistor, comprising:
    a first electrode layer made of a first material and having an upper and lower surface;
    a core member made of a second material and having an upper and lower surface, at least a portion of said lower surface being in physical contact with said upper surface of said first electrode layer;

a second electrode layer made of the first material and having an upper and lower surface, at least a portion of said lower surface of said second electrode layer being in physical contact with at least a portion of said upper surface of said core member, at least a portion of said second electrode layer overlapping at least a portion of said first electrode layer;

a first backing layer made of a third material and at least a portion of said first backing layer in physical contact with said lower surface of said first electrode layer;

a second backing layer made of the third material and at least a portion of said second backing layer in physical contact with said upper surface of said second electrode layer, at least a portion of said second backing layer overlapping at least a portion of said first backing layer; and a filament comprising an alloy of the first, second and third materials and extending from said first electrode layer to said second electrode layer in a region where said first and second electrode layers overlap.

27. The resistor according to claim 26, wherein the first material is made of a barrier metal.

28. The resistor according to claim 27, wherein the barrier metal is one of molybdenum and tungsten.

29. The resistor according to claim 26, wherein the second material is made of hydrogenated amorphous silicon.

30. The resistor according to claim 26, wherein the third material is made of a barrier metal.

31. The resistor according to claim 27, wherein the barrier metal is one of molybdenum and tungsten.

* * * * *